United States Patent [19]
Johnson

[11] Patent Number: 5,177,755
[45] Date of Patent: Jan. 5, 1993

[54] LASER FEEDBACK CONTROL CIRCUIT AND METHOD

[75] Inventor: Keith Johnson, Orland Park, Ill.

[73] Assignee: Amoco Corporation, Chicago, Ill.

[21] Appl. No.: 708,501

[22] Filed: May 31, 1991

[51] Int. Cl.$^5$ ............................................. H01S 3/00
[52] U.S. Cl. ......................................... 372/38; 372/31
[58] Field of Search ................................... 372/29–32, 372/38, 69, 70

[56] References Cited

U.S. PATENT DOCUMENTS 4,672,192  6/1987  Muka et al. .......................... 372/29
4,847,477  7/1989  Smith .................................. 372/29

OTHER PUBLICATIONS

Thomas J. Kane, "Intensity Noise in Diode-Pumped Single-Frequency Nd:YAG Lasers and its Control by Electronic Feedback", *Photonics Technology Letters,* vol. 2, No. 4, Apr. 1990.

*Primary Examiner*—Léon Scott, Jr.
*Attorney, Agent, or Firm*—James A. Gabala; Thomas W. Tolpin; Frank J. Sroka

[57] ABSTRACT

A feedback circuit, comprising: means for producing from a laser light output a feedback signal which is representative of the noise and frequency dependent output intensity of the laser light output; means for applying a phase shift to the feedback signal; means for converting the feedback signal to a level signal which is representative of the noise in the laser light output; amplifying means for amplifying the phase shifted feedback signal as a function of the level signal to produce a current gain signal; and means for superimposing the current gain signal on the current flowing through the laser diode.

25 Claims, 4 Drawing Sheets of light signals is easier if the laser light is free of noise. Moreover, more useful information can be transmitted if intensity variations can be spread over a wide frequency range or band. Ideally, the amplitude of any noise present in the laser's output is not a function of frequency.

LASER FEEDBACK CONTROL CIRCUIT AND METHOD

TECHNICAL FIELD

This invention relates to the general subject of lasers and, more specifically, to a circuit and method for improving the performance of solid-state, diode-pumped lasers.

BACKGROUND OF THE INVENTION

One important use of lasers is in communications and information transfer, wherein one or more lasers transit modulated light intensity signals through one end of an optical fiber or cable. A receiver at the opposite end of the cable then converts the intensity variations in the laser light into useful information. Preferably, the intensity of the laser light is only a function of the modulation. Signal detection and separation of a plurality of light signals is easier if the laser light is free of noise. Moreover, more useful information can be transmitted if intensity variations can be spread over a wide frequency range or band. Ideally, the amplitude of any noise present in the laser's output is not a function of frequency.

A spectral analyzer is a device or instrument which displays the relative intensity of the frequency components of a laser light signal. Unwanted amplitude variations or changes in intensity represent noise. Laser noise is defined by the term Relative Intensity Noise (RIN), which is a measurement of optical power fluctuations over a specified band width. The observed spectrum from such an instrument represents the Relative Intensity Noise of a laser light signal. RIN is usually expressed in dB/Hz.

Semiconductor laser sources, such as laser diodes and laser diode arrays can be used alone or they can be used to pump another laser, such as laser using Nd:YAG (i.e., neodymium doped yttrium aluminum garnet as the lasant material. However used, a laser diode is activated or driven to produce laser light in response to the flow of DC electrical current from a power supply. When the RIN of the output of a diode-pumped solid-state laser is observed, it is characterized by distinct peak or a spectral region of high RIN. This peak is the result of the phenomenon of relaxation oscillation. A. E. Siegman, *Lasers*, University Science Books, Mill Valley, Cailf.; Chapter 25, 1986. Relaxation oscillations are small amplitude, quasi-sinusoidal exponentially damped oscillations. For diode pumped solid-state lasers (e.g., Nd:YAG), the spectral region is typically between 100 KHz and 1 MHz. Relaxation oscillation is thought to be dependent on the fluorescence lifetime of the lasant material, cavity lifetime of the laser system, and cavity losses.

One means of reducing RIN in a diode-pumped solid-state laser is to use electronic feedback. Kane, "Intensity Noise in Diode-Pumped Single-Frequency Nd:YAG Lasers and its Control by Electric Feedback", *IEEE Photonics Technology Letters*, Vol. 2, No. 4, April 1990. In particular, a photo-diode was used to sense the output of the laser system, and an amplifier was used to convert the output of the photo-diode into a phase shifted feedback signal which is added to the output of the DC Power Supply which is used to drive the system's laser diode. A positive phase shift, applied at all frequencies from the relaxation oscillation frequency up to the frequency where loop gain goes below unity, was needed to avoid instability. This phase lead was accomplished by designing the amplifier so that gain is rising as a function of frequency, as is the case of a differentiator.

The Kane feedback circuit does not take in consideration changes in the performance of the laser diode over the life of the laser diode. The relaxation oscillation frequency of a laser system changes over its life. Moreover, there is no teaching or suggestion as to how such a circuit should be arranged or physically located relative to the laser diode and its power supply to minimize noise and interference. Thus, there are many areas in which improvements can be made.

SUMMARY OF THE INVENTION

One object of the present invention is to provide an improved feedback circuit for a laser system wherein a laser diode is used as a source of laser light.

A general object of this invention is to minimize Relative Intensity Noise generated in a laser system employing a laser diode or laser semiconductor driven or activated by electrical current to laser light.

Another object of the invention is to provide an electronic control circuit and method for reducing Relative Intensity Noise and its effects in a laser system using a laser diode to produce optical pumping.

Still another object is to provide a circuit which uses a photo-diode to provide a feedback signal which is representative of the high frequency noise in the output of an optically-pumped solid-state laser, wherein a laser diode is used to provide optically pumped radiation.

Yet another object of the present invention is to provide a circuit to reduce the effects of Relaxation Oscillation Noise in a laser system, wherein optical radiation is produced in response to a laser diode.

A final object of the invention is to disclose a feedback control circuit which can be located in close proximity to the output end of a laser diode pumped solid-state laser.

The objects of this invention can be attained through the steps of: sensing the output of a laser diode pumped laser system and producing an electrical feedback signal; amplifying said feedback signal over a frequency band which includes the Relaxation Oscillation Frequency of said laser system, said amplified feedback signal increasing as a function of the frequency of said feedback signal for at least a portion of said frequency band; shifting the phase of said amplified feedback signal over said frequency band as a function of the frequency of said amplified feedback signal and maintaining the gain of said feedback signal; and superimposing said phase shifted feedback signal onto the current supplied to said laser diode.

In particular, a feedback circuit is provided for a laser system which, in response to a flow of electrical current through a laser diode, produces a laser light output which is characterized by amplitude noise which is a function of the frequency at which the laser system operates. The feedback circuit comprises: feedback means, using the laser light output of a laser system which produces light in response to the flow of current through a laser diode, for producing a feedback signal which is representative of the amplitude noise in the laser light output, said feedback means having a gain curve which has a maximum intemediate the ends of a predetermined frequency band which includes that portion of said amplitude noise due to the relaxation oscillation frequency of the laser diode; phase shifting means for applying a phase shift to said feedback signal over said predetermined frequency band while maintaining the gain generally the same; and output means, using said phase shifted feedback signal, for producing a current gain signal and superimposing said current gain signal on the electrical current flowing through the laser diode to reduce said amplitude noise generally due to said relaxation oscillation of said laser diode.

Preferably, the feedback circuit includes converting means for converting the feedback signal to a level signal which is a function of the mean of said amplitude noise in the laser light output, and the output means produces said current gain signal in response to said level signal. Such an arrangement effectively automatically takes into consideration the change in performance of a laser diode and laser cavity over their life.

Numerous other advantages and features of the present invention will become readily apparent from the following detailed description of the invention, the embodiment described therein, the claims, and from the accompanying drawings.

BRIEF DESCRIPTION OF THE INVENTION

DESCRIPTION OF THE PREFERRED EMBODIMENTS

Figure 1:
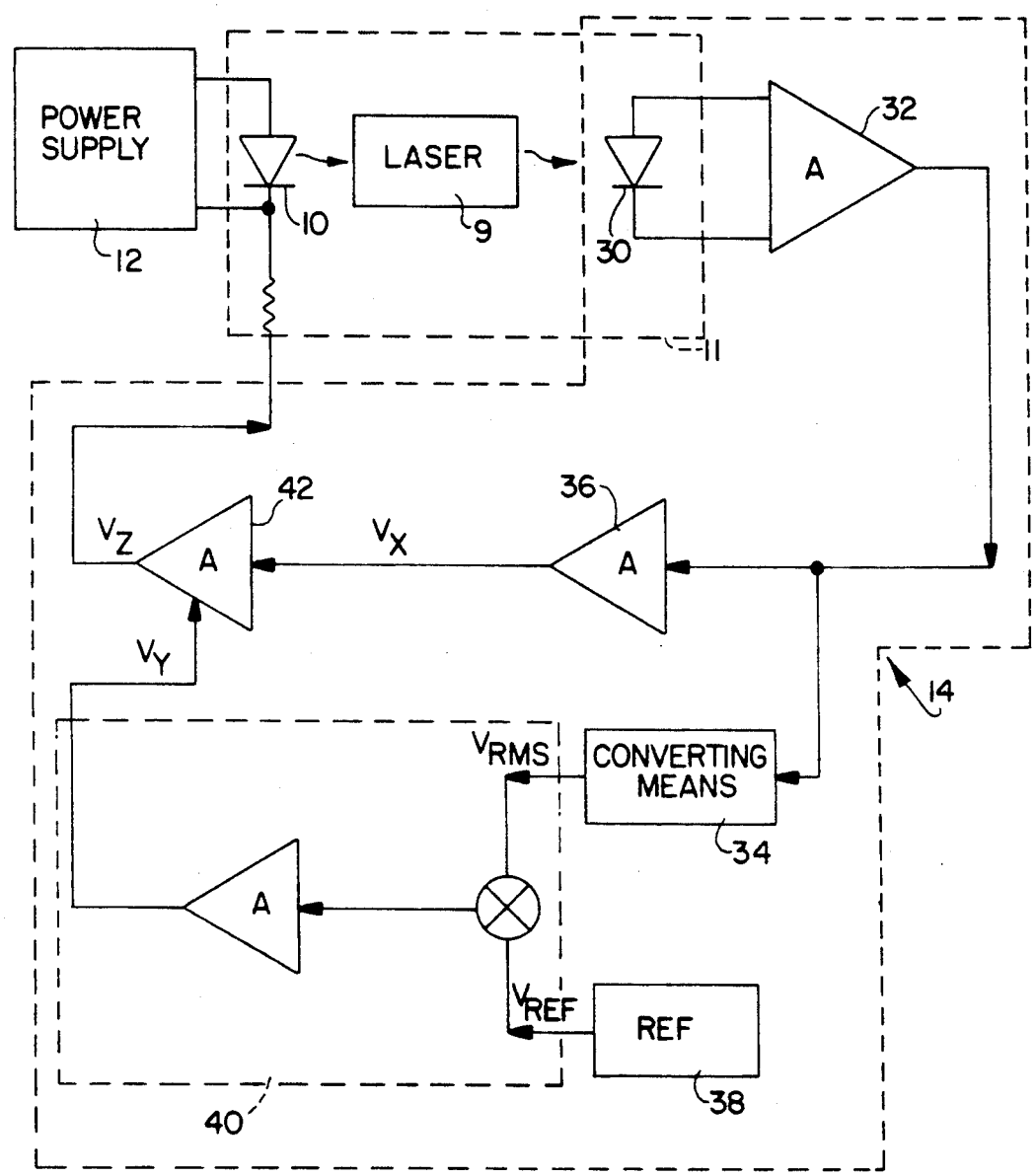
FIG. 1 is a block diagram of the feedback circuit of the present invention.

While this invention is susceptible of embodiment in many different forms, there is shown in the drawings and will herein be described in detail one specific embodiment of the invention. It should be understood, however, that the present disclosure is to be considered an exemplification of the principles of the invention and is not intended to limit the invention to specific embodiments illustrated.

Figure 2:
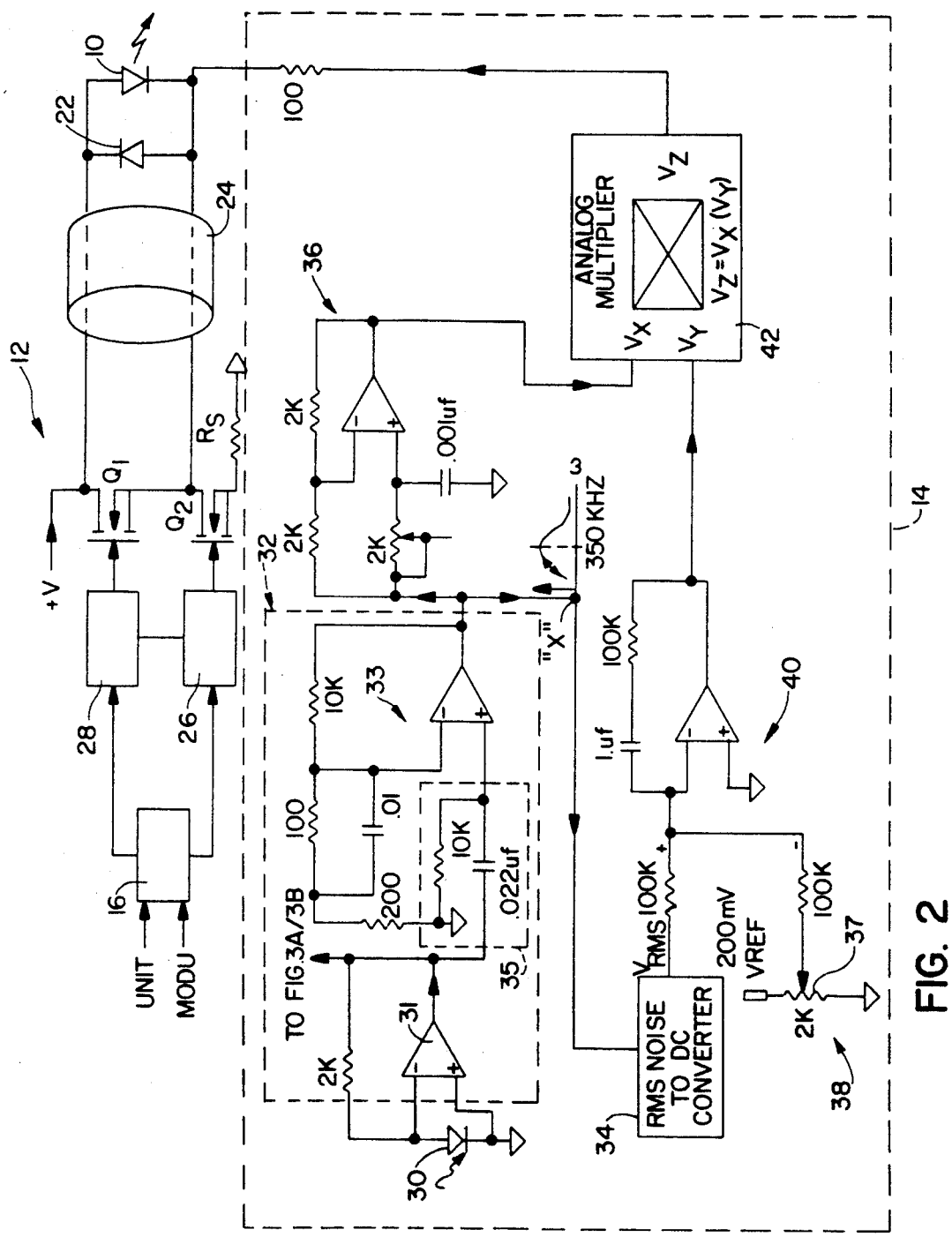
FIG. 2 is an electrical schematic diagram of the feedback control circuit shown in FIG. 1.

Turning to FIG. 1, there is illustrated: a laser system which produces a laser light output in response to the flow of electrical current through a semi-conductor component 10, such as a laser diode or laser diode array; a solid-state laser 9 which is pumped by the light from the semi-conductor component; a Power Supply or driver circuit 12 for the semi-conductor component; and an Automatic Relaxation Oscillation Noise Reduction Circuit 14 that is the subject of the present invention. Circuit components of one practical embodiment are shown in FIG. 2.

Suitable semi-conductor components 10 include, but are not limited to, laser diodes, light-emitting diodes (including superluminescent diodes and superluminescent diode arrays) and laser diode arrays, together with any ancillary packaging or structures. For example, such devices are commonly attached to a heat resistant and conductive heat sink and are packaged in a metal housing.

For efficient operation, the pumping radiation emitted by the semi-conductor component 10 is desirably matched with a suitable absorption band of a lasant material. Although the invention is not to be so limited, a highly suitable optical pumping source consists of a gallium aluminum arsenide laser diode, which emits light having a wavelength of about 810 nm, that is attached to heat sink. The heat sink can be passive in character. However, heat sink can also compromise a thermoelectric cooler or other temperature regulation means to help maintain the semi-conductor component 10 at a constant wavelength.

Without loss of generality the discussion which follows will concern itself with a semi-conductor component 10 in the form of a laser diode or laser diode array. Those skilled in the art know that when a laser diode or diode array is placed in operation, it is characterized by relaxation oscillations. Relaxation oscillations give to amplitude noise. Although the following discussion makes reference to a laser diode or laser diode array, it should be understood that the present invention is directed to any semi-conductor source which exhibits relaxation oscillation or its equivalent.

Turning to FIG. 2, the Power Supply 12 comprises a Current Control 16 which operates within present limits and/or under a modulation control signal, a Current Source 26, and a Protective Shunt Circuit 28. Protection against reverse bias is provided by an opposing diode 22 in parallel with a semi-conductor source in the form of a laser diode 10. In this particular embodiment, the laser diode 10 is remotely located (i.e., at the "output end" of the laser) from the Power Supply 12 by means of a cable and is held in a support structure (e.g., U.S. Pat. No. 4,731,795 to Clark et al.) which is connected to the power supply by means of a cable 24. Power supplies or driver circuits for laser diodes are well known to those skilled in the art (e.g., See U.S. Pat. No. 4,809,286 to Kollanyi et al. and R. Quenelle, "Diode-laser drivers address special requirements," *Laser Focus World*, p. 129, January 1991.) and need not be discussed in greater detail.

The Automatic Relaxation Oscillation Noise Reduction Circuit 14 comprises: a photo-diode 30 which receives laser light from the laser diode 10 (or through a solid-state laser 9 pumped by the laser diode); a frequency dependent Amplifying Means 32 for the signal from the photo-diode; Converting Means 34 for converting the noise-output from the Amplifying Means to a DC signal $V_{RMS}$; Phase Shifting Means 36 for providing a phase shift to the output of the Amplifying Means without introducing additional gain; Reference Means 38 for providing a DC reference signal $V_{REF}$; Servo Means 40 for summing and amplifying the noise signal and the reference signal; and Multiplying Means 42 for amplifying and sending the phase-shifted signal $V_x$ out of the Amplifying Means to the laser diode, as a function the amplified sum $V_y$ of the DC equivalent of the noise dependent signal and the DC reference signal.

The AC output of the Amplifying Means 32 is a feedback signal. It is passed to the Phase Shifting Means 36 and to the Converting Means 34. Preferably, all of the gain in the Automatic Relaxation Oscillation Circuit 14 takes place in the Amplifying Means 32. Referring to FIG. 2, the Amplifying Means 32 comprises an operational amplifier 31 whose inputs are connected across the photo-diode 30, a high pass filter 35 and a frequency dependent (i.e., band width limiting) operational amplifier circuit 33. The output from the operational amplifier 31 is sent through a high pass RC filter 35. Here the high pass filter has a lower cutoff frequency of about 670 Hz. The frequency dependent amplifying circuit 33 operates to amplify higher frequency signals in preference to lower frequency signals, and has a characteristic much as that shown in FIG. 2 at point "X". The circuit response and gain are set to limit oscillation in the laser system.

Preferably, the Converting Means 34 produces a DC output signal which is representative of the root mean squared (RMS) of the high frequency noise in the feedback signal (i.e., the square root of the mean of the squares of the instantaneous feedback signals). That high frequency noise includes that due to the Relaxation Oscillation Frequency of the laser diode. An Analog Devices AD636 may be used for this function. A DC output signal $V_{RMS}$ results.

The Phase Shifting Means 36 takes the feedback signal from the Amplifying Means 32 and introduces a frequency dependent phase shift which increases from 0° to $-180°$ as the frequency of the signal from the Amplifying Means increases. Preferably, the phase shift is relatively constant (e.g., unity gain) over a predetermined frequency band. Here the Phase Shifting Means 36 functions much as a First-Order All-Pass Filter.

The Reference Means 38 comprises a potentiometer or "pot" 37 connected across a DC voltage reference $V_{REF}$ (e.g., a Zener Diode, a band gap reference such as a National Semiconductor LM 385Z-1.2, etc.). Adjusting the pot 37 establishes an adjustable DC voltage which is summed with the output $V_{RMS}$ of the Converting Means 34 in the Servo Means 40.

The Servo Means 40 comprises an operational amplifier having an RC feedback loop. As such, it functions as an augmenting integrator to provide a smooth proportional-plus-reset control function in response to the difference between $V_{REF}$ and $V_{RMS}$.

The output from the Phase Shifting Means 36 is combined with the output from the Servo Means 40 in the Multiplex Means 42. Here an Analog Devices AD539 is used to produce an output current signal which is a function of the product of the output from the Servo Means 40 and the output of the Phase Shifting Means 36. This output current signal is superimposed on the current flowing from the Power Supply 12 to drive the laser diode 10. Because the phase of the output of the Phase Shifting Means becomes increasingly negative as the frequency of the signal out of the photo-diode increases, a negative feedback current signal is superimposed on the laser diode 10. Preferably, the feedback current is sufficient to substantially reduce the amplitude noise which is in the laser system output and which is due to the relaxation oscillation frequency of the laser diode.

Figure 3A:
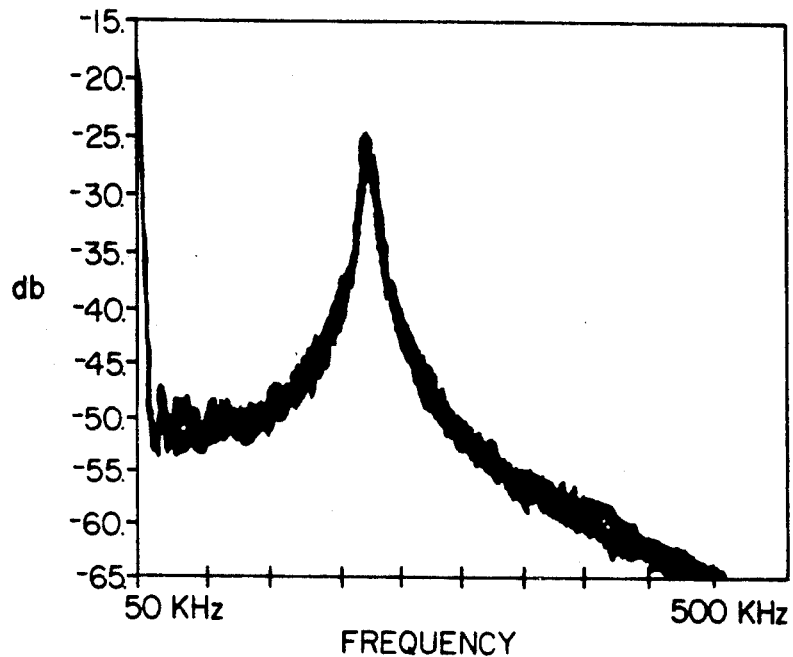
FIGS. 3A and 3B are graphical representations of Relative Intensity Noise without using the feedback circuit and after using the feedback circuit that is subject of the present invention.
Figure 3B:
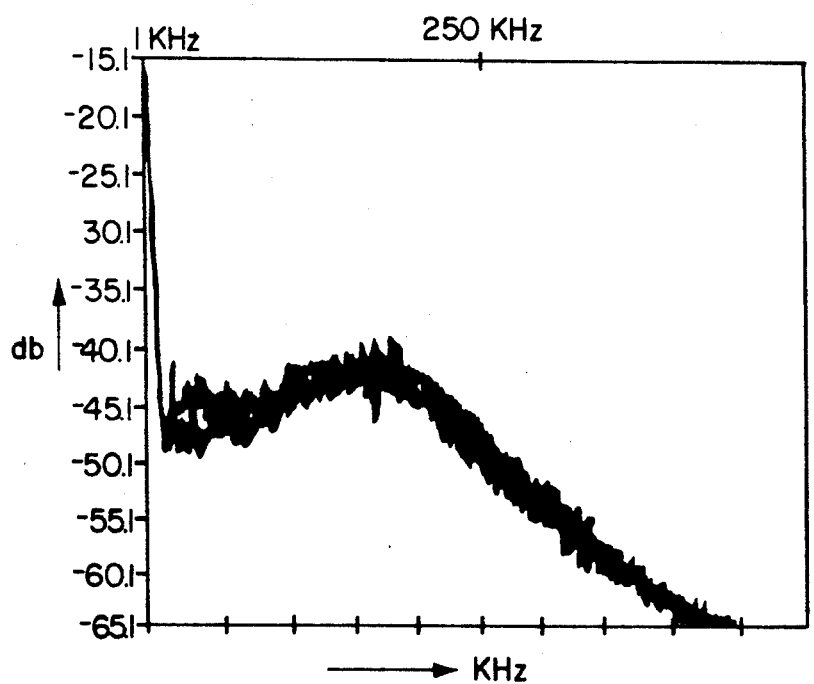

FIG. 3A shows the RIN which would appear at the output of a photo diode detector in the absence of the circuit that is the subject of the present invention. FIG. 3B shows the RIN when the Automatic Relaxation Oscillation Noise Reduction Circuit is used.

Preferably, the Automatic Relaxation Oscillation Noise Reduction Circuit 14 is located remotely from the Power Supply 12 and in close proximity to the laser diode 10 (e.g., in the laser head 11 at the output end of the laser system). One advantage of this arrangement is that it allows the Automatic Relaxation Oscillator Noise Reduction Circuit 14 to operate independent of the Power Supply 12 (i.e., the Power Supply can be replaced without affecting the Automatic Relaxation Oscillation Noise Reduction Circuit). Another advantage is that there is less chance of picking up external noise. In other words, the closer the noise reduction circuit is to the location of the diode laser 10, the greater the likelihood that interference will be picked up.

Figure 4:
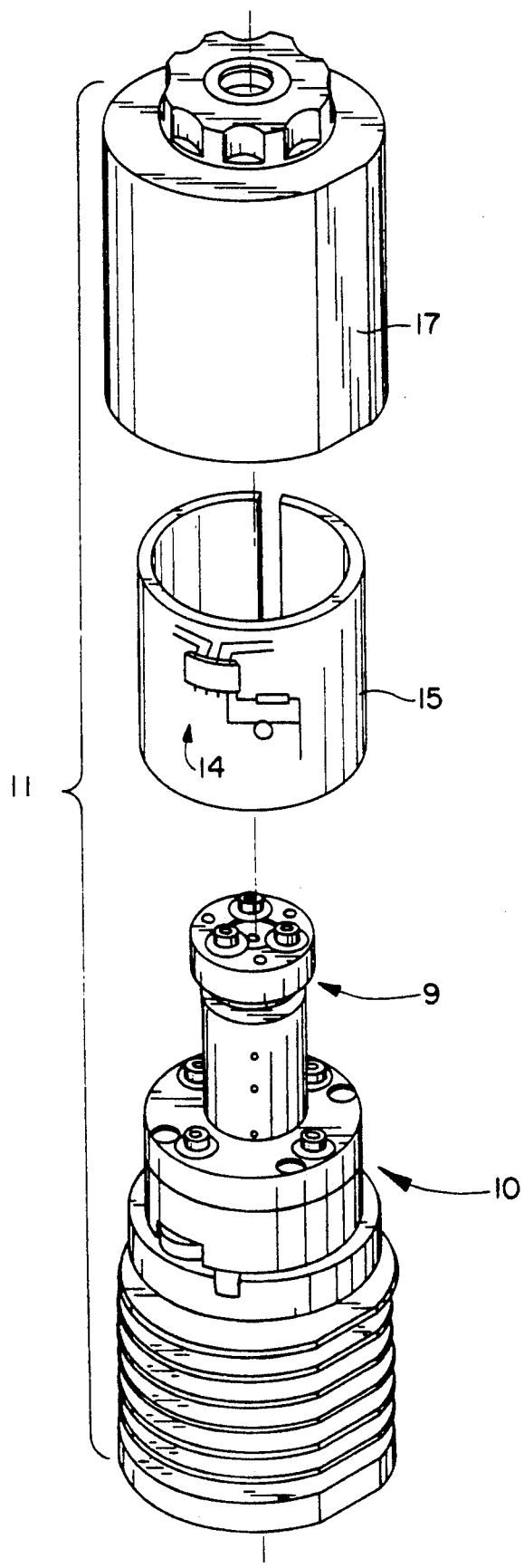
FIG. 4 is an exploded assembly drawing of a laser head and the means used to mount therein the feedback circuit of FIG. 1.

Some laser heads are generally cylindrical in shape (see U.S. Pat. No. Des. 312,445 to Crosby and assigned to the assignee of the present invention). One especially novel feature of the present invention is the concept of mounting the noise reduction circuit on a flexible circuit board which can be bent to fit the inside of the laser head. Such an arrangement is shown in FIG. 4. Here the circuit board 15 is made from a flexible material, such as KAPTON and it is bent around the support structure for the laser diode 10 and laser 9 and inside the cover or housing 17 of the laser head 11. One important advantage of a flexible circuit board is that the overall size of the head is unchanged even though additional components are added.

From the foregoing description, it will be observed that numerous variations, alternatives and modifications will be apparent to those skilled in the art. Accordingly, this description is to be construed as illustrative only and is for the purpose of teaching those skilled in the art. The manner of carrying out the invention. Various changes may be made, materials substituted and features of the invention may be utilized. For example, the output from the Phase Shifting Means 36 can be amplified and supplied to the laser diode without using the Converting Means 34 and the Servo Means 40. Using the Reference Means alone may be adequate for some less demanding situations. The Multiplexing Means 42 can be replaced with a manually adjustable amplifier; such a circuit would not automatically correct for the changes due to aging of the laser diode. The relaxation oscillation frequency usually changes over the lifetime of the laser diode and the solid-state laser which is pumped by that diode. Without automatic correction, the amplitude of the phase shifted signal would have to be manually adjusted over time. Thus, it will be appreciated that various modifications, alternatives, variations, etc., may be made without departing from the spirit and scope of the invention as defined in the appended claims. It is, of course, intended to cover by the appended claims all such modifications involved within the scope of the claims.

I claim:

1. In a laser system which, in response to a flow of electrical current through a laser diode, produces a laser light output which is characterized by amplitude noise which is a function of the frequency at which the laser system operates, a feedback circuit comprising:
   a) feedback means, using the laser light output of a laser system which produces light in response to the flow of current through a laser diode, for producing a feedback signal which is representative of the amplitude noise in the laser light output, said feedback means having a gain curve which has a maximum intermediate the ends of predetermined frequency band which includes that portion of said amplitude noise due to the relaxation oscillation frequency of the laser diode;
   b) phase shifting means for applying a phase shift to said feedback signal over said predetermined frequency band while maintaining the gain generally the same;
   c) converting means for converting said feedback signal to a level signal which is a function of the mean of said amplitude noise in the laser light output; and d) output means, using said phase shifted feedback signal and said level signal, for producing a current gain signal and superimposing said current gain signal on the electrical current flowing through the laser diode to reduce amplitude noise generally due to said relaxation oscillation of said laser diode.

2. The circuit of claim 1, wherein said converting means comprises RMS noise to voltage converter means for converting said feedback signal to a level signal which is a representative of the square root of the square of said mean.

3. The circuit of claim 1, wherein said converting means comprises:
reference means for producing a reference voltage;
means for converting said feedback signal to a signal voltage which is representative of the square root of the squares of said mean of said amplitude noise in said feedback signal; and
means for combining said reference voltage and said signal voltage to produce said level signal.

4. The circuit of claim 1, wherein said phase shifting means is characterized by unity gain and a phase shift which increases from 0 degrees to −180 degrees as the frequency of said feedback signal increases across said frequency band.

5. The circuit of claim 1, wherein said output means comprises an analog multiplier which has an X-input port, a Y-input port, and a Z-output port which is a function of the product of the voltage applied to said X-input port and the voltage applied to said Y-input port, said phase shifted feedback signal being applied to one of said input ports and said level signal being applied to the other of said input ports.

6. The circuit of claim 1, wherein the diode laser pumps a solid state laser which produces the laser light output.

7. The circuit of claim 1, wherein said feedback means comprises a photo-diode which is positioned to receive at least a portion of said laser light output and which is operatively connected to an amplifier.

8. The circuit of claim 7, wherein said laser system comprises a power supply and a laser head which is remotely located and connected to said power supply;
wherein said laser head carries the laser diode and a solid-state laser which is pumped by the laser diode to produce said laser light output; and
wherein said feedback means, said phase shifting means, and said output means are carried by said laser head.

9. The circuit of claim 1, wherein said laser system comprises a power supply and a laser head which is remotely located and connected to said power supply; and
wherein said laser head comprises a support structure which carries the laser diode and a solid-state laser which is pumped by the laser diode to produce the laser light output.

10. The circuit of claim 9, wherein said laser head comprises:
an elongated housing in which said support structure is located; and
flexible means for carrying, on at least one flexible circuit board, at least some part of one of said phase shifting means, said converting means and said output means.

11. The circuit of claim 10 wherein said housing and said support structure are generally cylindrical in shape; and wherein said at least one flexible circuit board is located between said support structure and said housing and is bent to have the general shape of at least part of a cylinder.

12. A laser system, comprising:
a) a semi-conductor light source characterized by a relaxation oscillation frequency;
b) means for supplying current to said semi-conductor light source to produce laser light which is characterized by amplitude noise which is a function of the said relaxation oscillation frequency;
c) photo-diode means, which is responsive to said laser light, for producing a feedback signal which is a function of the relative intensity of said noise;
d) means for producing phase shifted feedback signal from said feedback signal; and
e) output means for applying to said current to said semi-conductor light source a negative feedback output current signal which has a value which is a function of said phase shifted feedback signal and of a variable control signal and which has the effect of substantially reducing said amplitude noise.

13. The laser system of claim 12, wherein said output means comprises an analog multiplier having an output which is proportional to the product of two input signals; and wherein said two input signals comprise said phase shifted feedback signal and said variable control signal.

14. The laser system of claim 12, further including: converting means for converting said feedback signal to a control signal which is a function of the mean value of said amplitude noise; and combining means for combining said control signal and an adjustable signal to produce said variable control signal.

15. The laser system of claim 14, wherein said combining means comprises servo amplifier means for algebraically adding said control signal from said converting means and said adjustable signal to produce said variable control signal.

16. The laser system of claim 15, wherein said servo amplifier means comprises:
a series circuit of a capacitor and a resistance; and
an operational amplifier having an output, an inverting input and a non-inverting input, wherein said series circuit connects said output with said inverting input and said non-inverting input is connected to a ground reference.

17. The laser system of claim 16, wherein said control signal from said converting means and said adjustable signal are DC signals and are fed to said inverting input of said operational amplifier.

18. The laser system of claim 12, wherein said means for producing a phase shifted feedback signal comprises:
an operational amplifier which has an output, an inverting input, a non-inverting input and a resistor for joining said output to said inverting input; and
a phase shifting circuit which connects said feedback signal to said inverting input and to said non-inverting input, said phase shifting circuit comprising:
means for connecting said feedback signal to said inverting input through a resistance;
means for connecting said feedback signal to said non-inverting input through resistance means; and
capacitor means for connecting said non-inverting input to a ground reference.

19. An automatic relaxation oscillation noise reduction circuit for a laser system whose output is characterized by relative intensity noise and is a function of the flow of current through laser diode means, comprising:
a) means for producing an electrical feedback signal which is representative of the optical output of the laser system;
b) means for shifting the phase of said feedback signal;
c) means for producing a control signal which is representative of the average noise in said feedback signal; and
d) means for controlling the gain of said phase shifted feedback signal as a function of said control signal to produce a feedback current which is applied to the laser diode means.

20. The circuit of claim 19, wherein said means for producing an electrical feedback signal comprises:
aa) first operational amplifier means having an output, an inverting input and a non-inverting input which is connected to a ground reference
ab) first resistor means for connecting said inverting input to said output; and
ac) photo-diode means which is located to receive the output of the laser system and which connects said non-inverting input to said ground reference.

21. The circuit of claim 20, further including:
a second operational amplifier means having an output, an inverting input which is joined to its output by a feedback resistor and a non-inverting input which is connected to said ground reference by a resistor and which is connected to the output of said first operational amplifier by a capacitor; and
a series parallel circuit comprising two resistors in series with each other for connecting said inverting input of said second operational amplifier to said ground reference and comprising capacitor means for connecting said inverting input to said ground reference through one of said two resistors.

22. The circuit of claim 19, wherein said means for shifting the phase of said feedback signal comprises an operational amplifier having an output, an inverting input which is connected to its output through one resistance and to said feedback signal by another resistance, and a non-inverting input which is connected to said feedback signal by resistance means and which is connected to said ground reference by capacitor means.

23. The circuit of claim 19, wherein said means for producing a control signal comprises:
a) a RMS noise to DC converter for receiving said feedback signal and producing a DC control voltage of one polarity;
b) a source of an adjustable DC voltage of opposite polarity; and
c) means for adding together said adjustable DC voltage and said DC control voltage and producing said control signal.

24. A method of automatically reducing relative intensity noise in the output of a laser diode pumped laser system over the life of the laser diode, comprising the steps of:
a) sensing the output of a laser diode pumped laser system and producing an electrical feedback signal;
b) amplifying said feedback signal over a frequency band which includes the Relaxation Oscillation Frequency of said laser system, said amplified feedback signal increasing as a function of the frequency of said feedback signal for at least a portion of said frequency band;
c) shifting the phase of said amplified feedback signal over said frequency band as a function of the frequency of said amplified feedback signal and maintaining the gain of said amplified feedback signal;
d) producing, from said amplified feedback signal, a control signal which is a function of the noise in said feedback signal; and
e) superimposing onto the current supplied to said laser diode a current signal which is a function of said phase shifted feedback signal and said control signal.

25. The method of claim 24, wherein step (e) the amplitude of said current signal is proportional to the product of said control signal and said phase shifted feedback signal.

* * * * *